United States Patent
Yang et al.

(10) Patent No.: US 10,522,349 B2
(45) Date of Patent: Dec. 31, 2019

(54) ANTI-REFLECTIVE COATING BY ION IMPLANTATION FOR LITHOGRAPHY PATTERNING

(71) Applicant: Taiwan Semiconductor Manufacturing Co., Ltd., Hsinchu (TW)

(72) Inventors: Cheng-Han Yang, Hsinchu (TW); Tsung-Han Wu, Hsinchu (TW); Chih-Wei Chang, Hsinchu (TW); Hsin-mei Lin, Hsinchu (TW); I-Chun Hsieh, Hsinchu (TW); Hsi-Yen Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/176,533

(22) Filed: Oct. 31, 2018

(65) Prior Publication Data
US 2019/0164745 A1    May 30, 2019

Related U.S. Application Data

(60) Provisional application No. 62/592,933, filed on Nov. 30, 2017.

(51) Int. Cl.
*H01L 21/027* (2006.01)
*H01L 21/308* (2006.01)
(Continued)

(52) U.S. Cl.
CPC .......... *H01L 21/0276* (2013.01); *G03F 7/091* (2013.01); *G03F 7/16* (2013.01);
(Continued)

(58) Field of Classification Search
None
See application file for complete search history.

(56) References Cited

U.S. PATENT DOCUMENTS

| | | | |
|---|---|---|---|
| 6,271,154 B1 | 8/2001 | Shen et al. | |
| 7,041,530 B2 * | 5/2006 | Nunoshita | B82Y 10/00 257/E21.346 |

(Continued)

FOREIGN PATENT DOCUMENTS

| | | |
|---|---|---|
| CN | 103155090 | 6/2013 |
| KR | 100653534 | 11/2006 |

(Continued)

*Primary Examiner* — Asok K Sarkar
(74) *Attorney, Agent, or Firm* — Haynes and Boone, LLP

(57) ABSTRACT

A method includes depositing a target layer over a substrate; reducing a reflection of a light incident upon the target layer by implanting ions into the target layer, resulting in an ion-implanted target layer; coating a photoresist layer over the ion-implanted target layer; exposing the photoresist layer to the light using a photolithography process, wherein the target layer reduces reflection of the light at an interface between the ion-implanted target layer and the photoresist layer during the photolithography process; developing the photoresist layer to form a resist pattern; etching the ion-implanted target layer with the resist pattern as an etch mask; processing the substrate using at least the etched ion-implanted target layer as a process mask; and removing the etched ion-implanted target layer.

20 Claims, 7 Drawing Sheets

(51) Int. Cl.
*H01L 21/306* (2006.01)
*H01L 21/266* (2006.01)
*H01L 21/265* (2006.01)
*G03F 7/38* (2006.01)
*G03F 7/20* (2006.01)
*G03F 7/26* (2006.01)
*G03F 7/09* (2006.01)
*G03F 7/16* (2006.01)

(52) U.S. Cl.
CPC .......... *G03F 7/2002* (2013.01); *G03F 7/2004* (2013.01); *G03F 7/2006* (2013.01); *G03F 7/26* (2013.01); *G03F 7/38* (2013.01); *H01L 21/266* (2013.01); *H01L 21/26513* (2013.01); *H01L 21/308* (2013.01); *H01L 21/30604* (2013.01)

(56) References Cited

U.S. PATENT DOCUMENTS

| | | | |
|---|---|---|---|
| 7,070,911 B1* | 7/2006 | Hopper | G03F 7/091 430/14 |
| 8,133,804 B1 | 3/2012 | Godet et al. | |
| 8,216,767 B2 | 7/2012 | Wang et al. | |
| 8,323,870 B2 | 12/2012 | Lee et al. | |
| 8,580,117 B2 | 11/2013 | Kao et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 2004/0072443 A1 | 4/2004 | Huang et al. | |
| 2005/0272265 A1 | 12/2005 | Geffken et al. | |
| 2008/0020324 A1* | 1/2008 | Shiu | G03F 7/11 430/311 |
| 2009/0149024 A1 | 6/2009 | Huang et al. | |
| 2010/0009536 A1* | 1/2010 | Ghandehari | H01L 21/0276 438/689 |
| 2011/0186749 A1 | 8/2011 | Godet et al. | |
| 2013/0062309 A1 | 3/2013 | Godet et al. | |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1* | 7/2014 | Chang | G03F 7/20 430/322 |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0272728 A1 | 9/2014 | Sinclair et al. | |
| 2014/0273521 A1 | 9/2014 | Wu et al. | |
| 2015/0214056 A1* | 7/2015 | Xu | H01L 21/266 438/514 |
| 2016/0064239 A1 | 3/2016 | Shih et al. | |
| 2017/0338103 A1 | 11/2017 | Shih et al. | |

FOREIGN PATENT DOCUMENTS

| | | |
|---|---|---|
| KR | 20130124149 | 11/2013 |
| KR | 20130138786 | 12/2013 |
| WO | WO2011/116039 | 9/2011 |

* cited by examiner

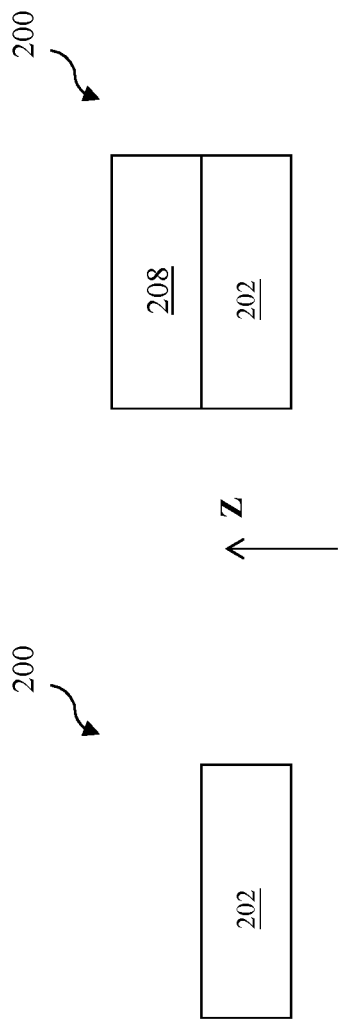
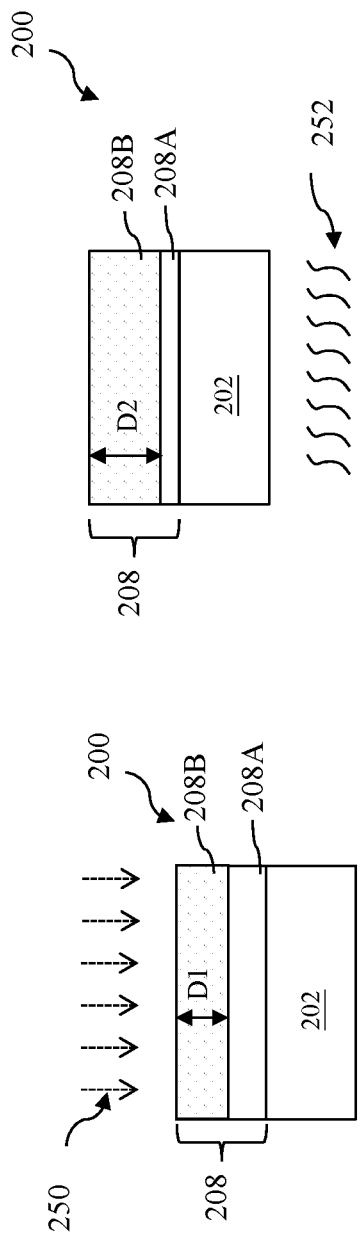
FIG. 2A
FIG. 2B
FIG. 2C
FIG. 2D

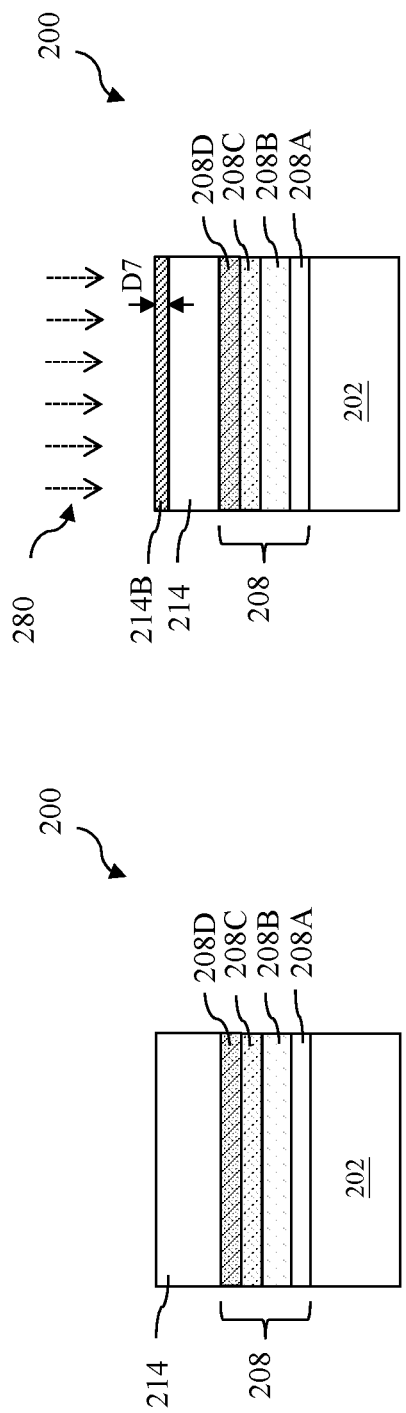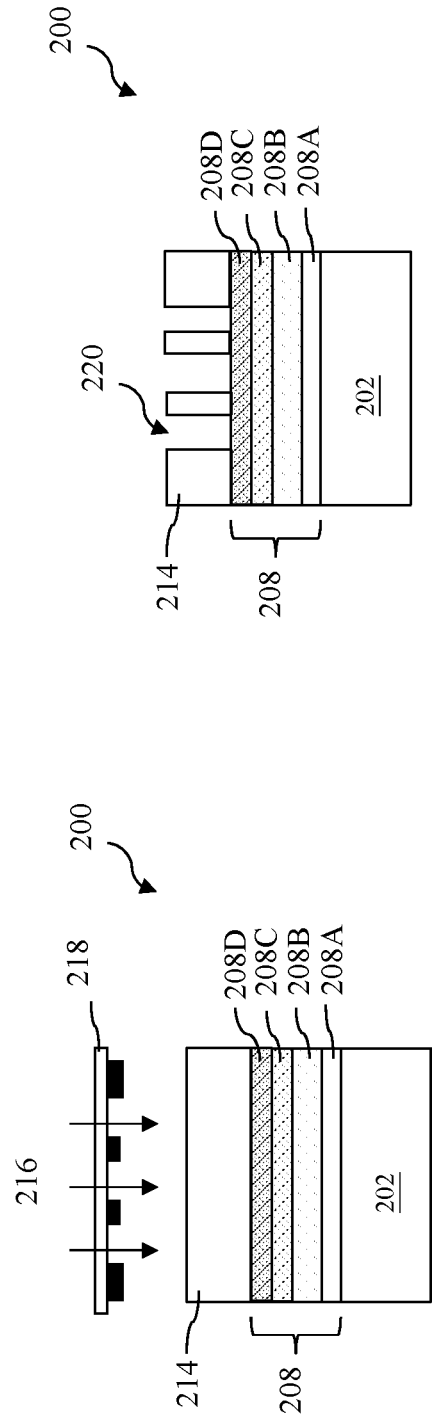

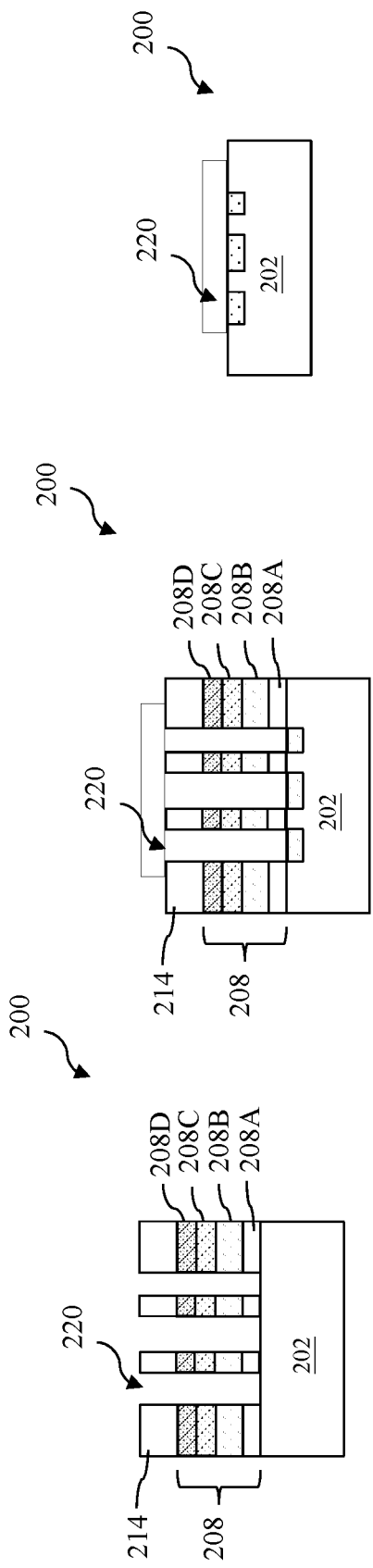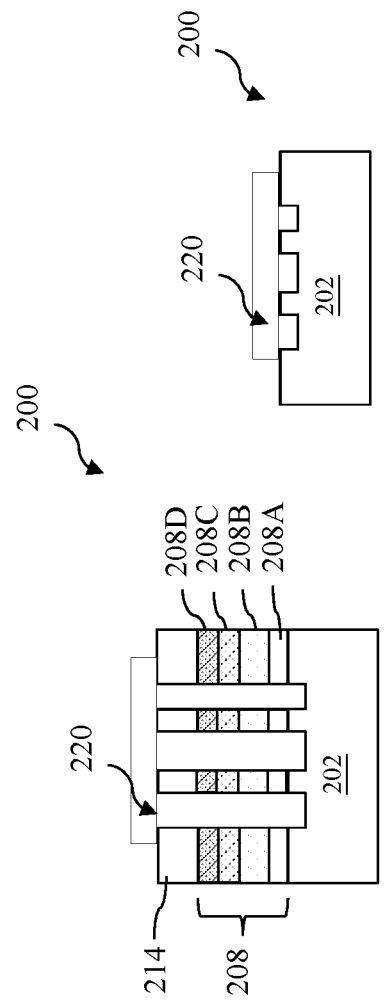

ANTI-REFLECTIVE COATING BY ION IMPLANTATION FOR LITHOGRAPHY PATTERNING

PRIORITY

This claims the priority to and benefits of U.S. Prov. App. Ser. No. 62/592,933, filed Nov. 30, 2017, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, reflectivity control has been challenging for lithography. In a typical lithography process, a resist film is coated on a surface of a wafer and is subsequently exposed and developed to form a resist pattern. The resist pattern is then used for etching the wafer to form features of an IC. When the resist film is exposed with a radiation, it is important that reflection of the radiation by any resist under-layers be controlled. Otherwise, the reflection might negatively affect the resist pattern resolution and critical dimension (CD). Reflection control is particularly troublesome when the wafer has topography with high aspect ratio, such as complicated FinFET structures or other three-dimensional microstructures. One approach is to apply an anti-reflective coating (ARC) layer underneath the resist layer and use the ARC layer to absorb the radiation during exposure. An object of the present disclosure is directed to methods of forming this ARC layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, 2E, 2F, 2G, 2H, 2I, 2J, 2K, 2L, 2M, 2N-1, 2N-2, 2O-1, and 2O-2 illustrate cross sectional views of forming a semiconductor structure according to the method of FIGS. 1A-C, in accordance with some embodiments.

DETAILED DESCRIPTION

Figure 1A:
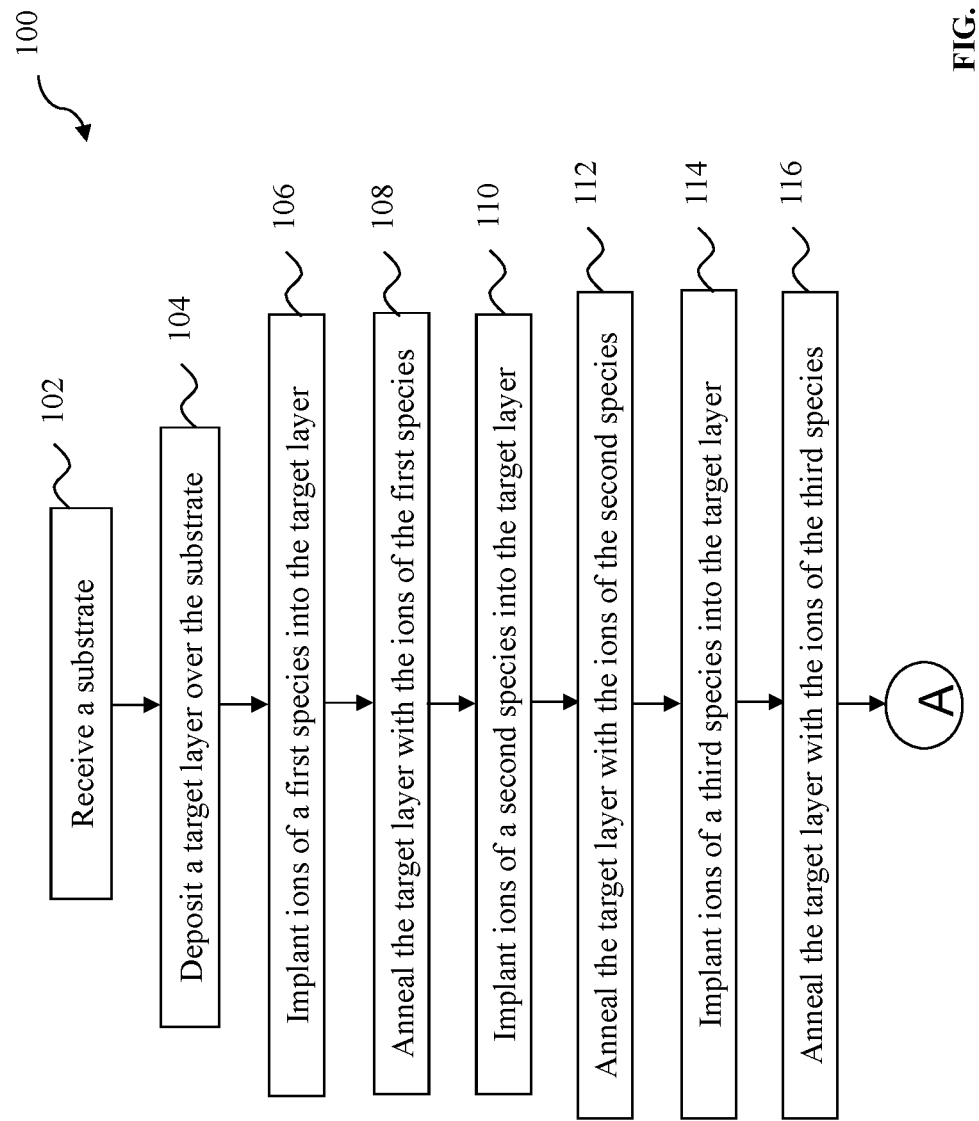
FIGS. 1A, 1B, and 1C illustrate a flow chart of a lithography patterning method according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to methods for semiconductor device fabrication, and more particularly to forming anti-reflective coating (ARC) by ion implantation in lithography patterning. According to some aspects of the present disclosure, an ARC layer is formed by depositing a material layer over a substrate, implanting ions of two or more species into the material layer, and annealing the material layer so that the ions diffuse to appropriate depths in the material layer to form an ion-implanted material layer. The ion-implanted material layer provides different refractive indexes along its depth direction. By choosing the types of ion species and the conditions for ion implantation and annealing, the ion-implanted material layer may provide high absorbance and low reflectivity for a given radiation wavelength used during photolithography processes. The disclosed method of forming an ARC layer by ion implantation provides advantages over those forming ARC layers by multiple depositions, such as by CVD or PVD or other methods. One advantage is that the disclosed method can create more layers with different and fine-tuned refractive indexes than the multi-deposition methods and with less fabrication time. Further, the disclosed method can create an ARC layer with gradient refractive indexes to achieve a lower reflectivity than some ARC layers formed by multi-deposition methods. Compared to forming an ARC layer using inhomogeneous gradient microstructures such as nano-porous films, the disclosed method is better in controlling the refractive indexes in the ARC layer, and the ion-implanted ARC layer typically provides better etching resistance than the nano-porous films because the ion-implanted ARC layer in some embodiments of the present disclosure include inorganic materials such as nitride or metal. The better etching resistance helps to achieve better critical dimensions of the etched patterns.

Figure 1B:
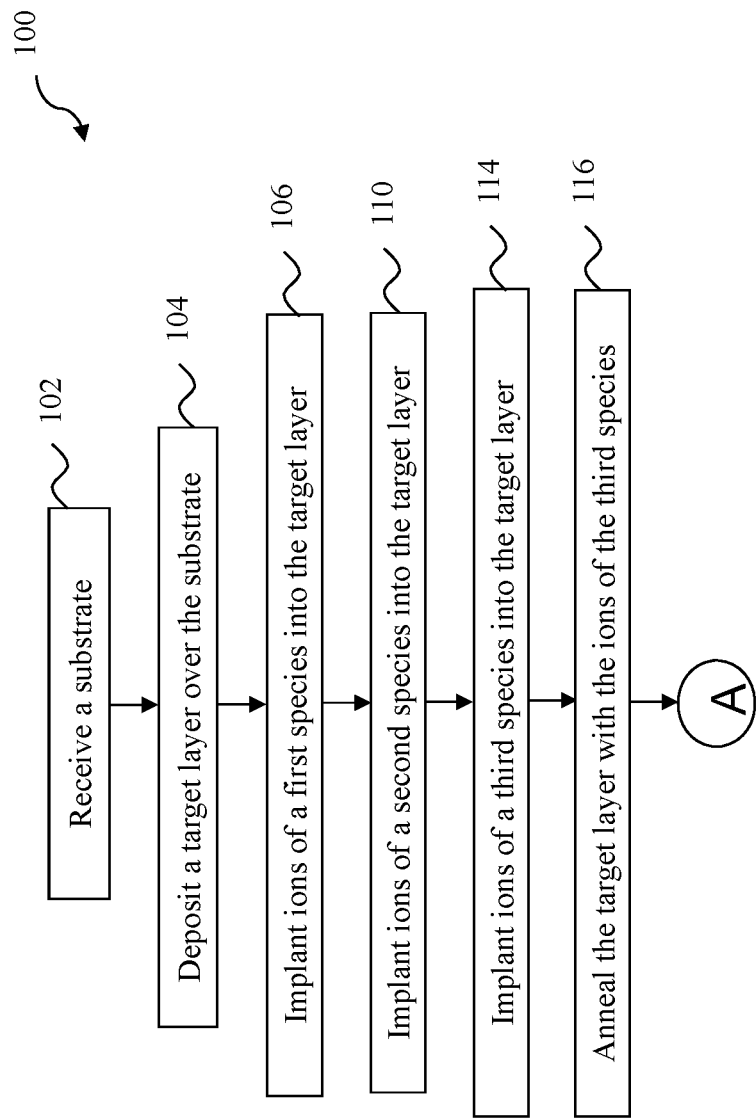
Figure 1C:
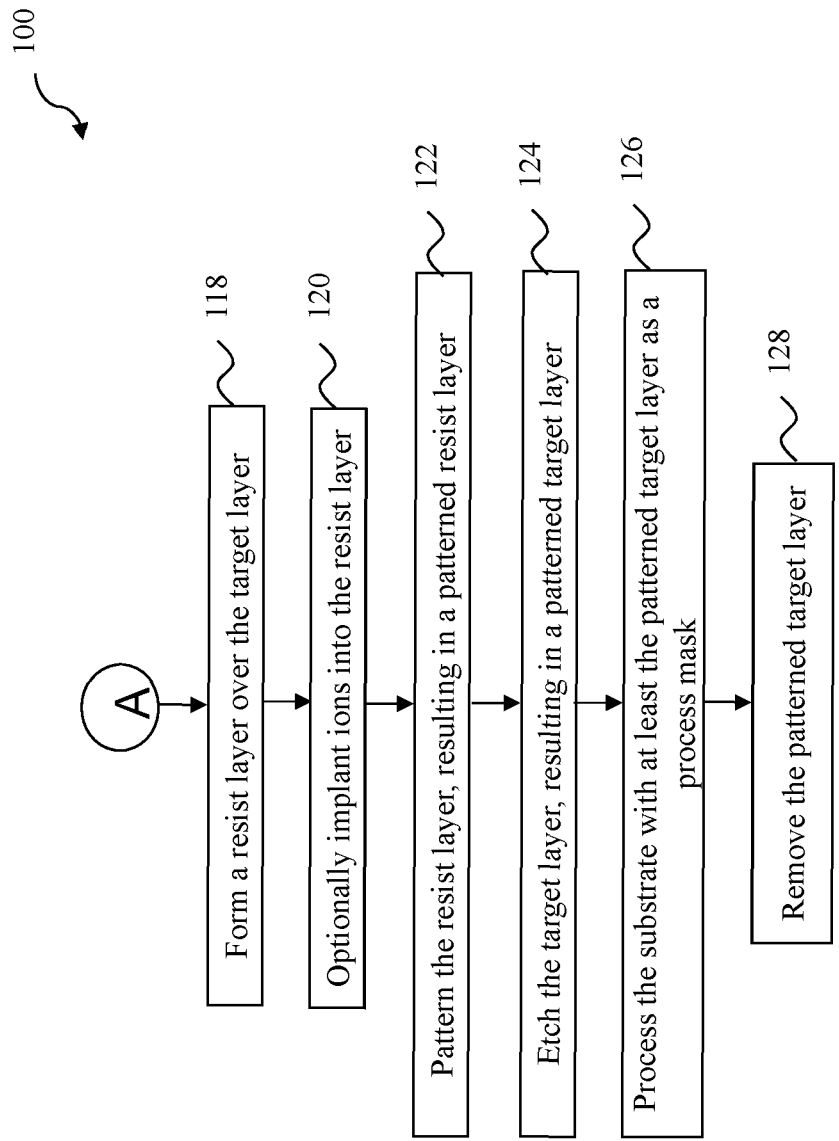

FIGS. 1A-1C show a flow chart of a method 100 of patterning a substrate (e.g., a semiconductor wafer or a mask substrate) according to various aspects of the present disclosure. FIGS. 1A and 1B show two alternative embodiments of parts of the method 100. Additional operations can be provided before, during, and after the method 100, and some operations described can be replaced, eliminated, or moved around for additional embodiments of the method. The method 100 is an example, and is not intended to limit the present disclosure beyond what is explicitly recited in the claims. The method 100 is described below in conjunction with FIGS. 2A-2O-2 wherein a structure 200 is fabricated by using embodiments of the method 100. The structure 200 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof. In some embodiments, the structure 200 may also be a mask or a reticle for making an IC.

The method 100 (FIG. 1A) receives a substrate 202 (FIG. 2A) at operation 102. Referring to FIG. 2A, the substrate 202 includes one or more layers of material or composition, and is to be processed using lithography patterning methods disclosed herein. In an embodiment, the substrate 202 is a semiconductor substrate (e.g., a wafer). In another embodiment, the substrate 202 includes silicon in a crystalline structure. In alternative embodiments, the substrate 202 includes other elementary semiconductors such as germanium; or a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers. The top surface of the substrate 202 may be planar or may include various structures having a high aspect ratio, such as semiconductor fins and/or gate structures. In another embodiment, the substrate 202 is a mask substrate (sometimes referred to as a mask blank) which may be patterned with IC patterns to form a mask or a reticle. For example, the substrate 202 may include a radiation-absorbing layer over a transparent layer for making a transmissive mask or include a radiation-absorbing layer over a reflective layer for making a reflective mask. In either case, the radiation-absorbing layer may be patterned using the method 100 disclosed herein.

The method 100 (FIG. 1A) proceeds to operations 104 by depositing a target layer 208 (FIG. 2B) over the substrate 202. The target layer 208 is to be processed using ion implantation and annealing to form an ARC layer, according to aspects of the present disclosure. In an embodiment, the target layer 208 includes an inorganic material, and may be deposited using CVD, PVD, or other suitable methods. In an embodiment, the target layer 208 includes single crystalline silicon or polycrystalline silicon. In another embodiment, the target layer 208 includes an oxide such as silicon dioxide or a metal oxide. For example, the metal oxide may include $TiO_2$. In another embodiment, the target layer 208 includes a nitride such as silicon nitride ($Si_3N_4$) or a metal nitride. For example, the metal nitride may include TiN. In yet another embodiment, the target layer 208 includes a metal film such as Ti. In an embodiment, the target layer 208 is deposited to a thickness (along the direction Z, the normal of the top surface of the substrate 202) that is greater than about 5000 Å, such as from about 5,001 Å to about 4 μm.

The method 100 (FIG. 1A) proceeds to operation 106 by implanting ions of a first species 250 (also referred to as ions 250) into the target layer 208 (FIG. 2C). Referring to FIG. 2C, a top portion 208B of the target layer 208 is implanted with ions of the first species 250. The top portion 208B has a thickness of D1, which is in a range from about 2500 Å to about 3500 Å in some embodiments, such as about 3180 Å. The upper limit of the thickness D1 should be designed to be smaller than the thickness of the target layer 208. Even further, after the ions are diffused in the target layer 208, the depth D2 (as shown in FIG. 2D) should be equal to or less than the thickness of the target layer 208. The lower limit of the thickness D1 should be designed according to how many ion-implanted layers will be included in the top portion 208B and the thickness of each such layer. As will be discussed below, the method 100 creates further ion-implanted layers inside the top portion 208B. If D1 is too small, it may not be feasible to add these layers into the layer 208B. A bottom portion 208A of the target layer 208 is not implanted with the ions 250. The first ion species 250 may be selected from, but not restricted to, the group consisting of boron, phosphorus, arsenic, germanium, fluorine, silicon, aluminum, nitrogen, carbon, argon, oxygen, and hydrogen. In the present embodiment, the target layer 208 will be implanted with ions of additional species in subsequent operations. The additional species may also be selected from the group consisting of boron, phosphorus, arsenic, germanium, fluorine, silicon, aluminum, nitrogen, carbon, argon, oxygen, and hydrogen. In the present embodiment, the first ion species 250 is selected to be the smallest (i.e., having the smallest atomic mass) among the ion species implanted into the target layer 208. Further in the present embodiment, among all the implanted ion species, the first ion species 250 is implanted to the deepest portions of the target layer 208. In this way, at least a portion (208B) of the target layer 208 includes substantially only the first species 250 while other ion species in this portion are negligible. This makes it easier to fine-tune the refractive index of this portion.

In an embodiment, the first ion species 250 is boron (B) and the target layer 208 includes silicon. To further this embodiment, the operation 106 performs the B ion implantation with an energy dose in a range from about 30 KeV to about 100 KeV and an ion dose in a range from 1E13 ions/cm$^2$ to 1E14 ions/cm$^2$. The ranges of energy dose and ion dose may be selected based on the materials of the target layer 208, the ion species 250, the desired depth D1, and the desired reflective and refractive index of the ion-implanted layer 208B. The range of energy dose affects how deep the ions are implanted, hence affecting the depth D1. If the energy dose is too high or too low, it will not achieve the desired depth D1. The range of ion dose affects the amount of impurity doping, which in turn affects the reflective and refractive index of the ion-implanted layer 208B. If the ion dose is too high or too low, it will not achieve the desired optical property of the ion-implanted layer 208B. In an embodiment, the B ions are implanted into the target layer 208 up to a depth D1 of about 2500 Å to about 3500 Å, such as about 3180 Å. In an embodiment, the energy dose in the operation 106 varies (e.g., with a uniform distribution) in the range from about 30 KeV to about 100 KeV so that the ions 250 are near uniformly distributed in the layer 208B. For example, with a higher energy dose, the ions tend to travel deeper into the target layer 208, and with a lower energy dose, the ions tend to travel shallower into the target layer 208. Further, the ion distribution is typically Gaussian. Therefore, by varying the energy dose, the layer 208B can be implanted with near uniform impurity concentration throughout its thickness D1. Further, the energy dose can be gradually increasing, gradually decreasing, oscillating between a minimum and a maximum, or by other means in various embodiments.

At operation 108, the method 100 (FIG. 1A) performs an annealing process 252 to the structure 200 including the target layer 208 implanted with the first ion species 250 (FIG. 2D). The annealing process 252 causes the ions 250 to diffuse deeper into the target layer 208 to a depth D2, where D2 is greater than D1. In an embodiment, the first ion species 250 is boron (B) and the target layer 208 includes silicon. To further this embodiment, the operation 108 performs the annealing process 252 at a temperature in a range from about 950° C. to about 1025° C. and for duration in a range from about 10 seconds to about 30 seconds. As a result, the depth D2 is in a range from about 3000 Å to about 5000 Å. After the annealing process 252, the thickness of the top portion 208B that includes the ion species 250 grows from D1 to D2. The annealing temperature and annealing time affect the ions' diffusion length. The disclosed annealing temperature and annealing time are selected to achieve the desired depth D2 (after annealing) from the initial implanted depth D1 (before annealing). Also, the annealing temperature is selected so that the device 200 can withstand the annealing process without being damaged.

Figure 2E:
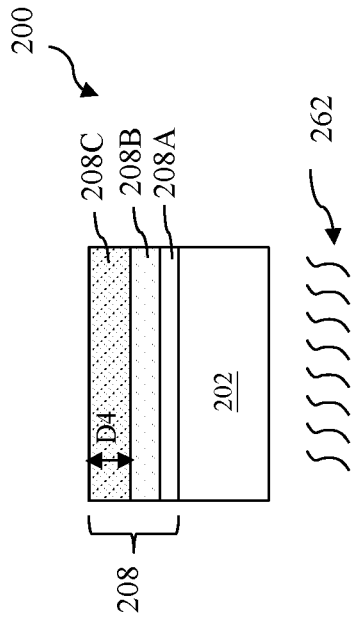
Figure 2F:
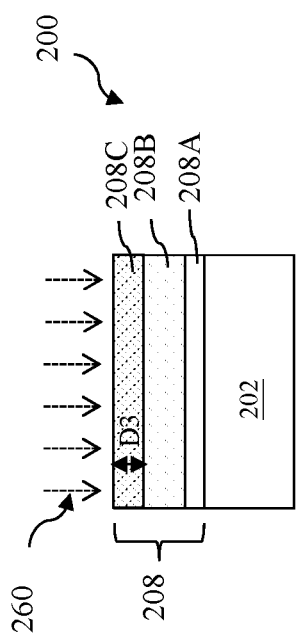

At operation 110, the method 100 (FIG. 1A) implants ions of a second species 260 (also referred to as ions 260) into the target layer 208 (FIG. 2E). Referring to FIG. 2E, a top portion 208C of the target layer 208 is implanted with ions of the second species 260. The top portion 208C has a thickness of D3, which is a smaller than D1 or D2. For example, the thickness D3 may be in a range from about 1200 Å to about 1500 Å in some embodiments, such as about 1342 Å. The upper limit of the thickness D3 should be designed to be smaller than the thickness D2. Even further, after the ions 260 are diffused in the target layer 208, the depth D4 (as shown in FIG. 2F) should be less than the thickness D2 in order to create a stack of ion-implanted layers. The lower limit of the thickness D3 should be designed according to how many ion-implanted layers will be included in the top portion 208C and the thickness of each such layer. As will be discussed below, the method 100 may create further ion-implanted layers inside the top portion 208C. If D3 is too small, it may not be feasible to add these layers into the layer 208C. The second species 260 may be selected from, but not restricted to, the group consisting of boron, phosphorus, arsenic, germanium, fluorine, silicon, aluminum, nitrogen, carbon, argon, oxygen, and hydrogen. In the present embodiment, the second species 260 is selected to be larger (i.e., having a greater atomic mass) than the ion species 250 in order to create the desired anti-reflectivity in the stacked ion-implanted layers. Also, using a larger ion species in the operation 110 than in the operation 106 allows the two operations to use the same or similar implantation energy to create a stack of ion-implanted layers 208C and 208B where the layer 208C is shallower than the layer 208B. This simplifies the manufacturing process, for example, the same ion implantation energy may be maintained in the various operations in the method 100. In an embodiment, the second ion species 260 is phosphorous (P). To further this embodiment, the operation 110 performs the P ion implantation with an energy dose in a range from about 30 KeV to about 100 KeV and an ion dose in a range from about 1E13 ions/cm$^2$ to about 1E14 ions/cm$^2$. The ranges of energy dose and ion dose may be selected based on the materials of the target layer 208, the ion species 260, the desired depth D3, and the desired reflective and refractive index of the ion-implanted layer 208C. The range of energy dose affects how deep the ions are implanted, hence affecting the depth D3. If the energy dose is too high or too low, it will not achieve the desired depth D3. The range of ion dose affects the amount of impurity doping, which in turn affects the reflective and refractive index of the ion-implanted layer 208C. If the ion dose is too high or too low, it will not achieve the desired optical property of the ion-implanted layer 208C. In an embodiment, the energy dose in the operation 110 varies (e.g., with a uniform distribution) in the range from about 30 KeV to about 100 KeV so that the ions 260 are near uniformly distributed in the layer 208C. For example, with a higher energy dose, the ions tend to travel deeper into the target layer 208, and with a lower energy dose, the ions tend to travel shallower into the target layer 208. Further, the ion distribution is typically Gaussian. Therefore, by varying the energy dose, the layer 208C can be implanted with near uniform impurity concentration throughout its thickness D3. Further, the energy dose can be gradually increasing, gradually decreasing, oscillating between a minimum and a maximum, or by other means in various embodiments.

At operation 112, the method 100 (FIG. 1A) performs an annealing process 262 to the structure 200 including the target layer 208 implanted with the first and second ion species 250 and 260 (FIG. 2F). The annealing process 262 causes the ions 260 to diffuse deeper into the target layer 208 to depth D4 that is greater than D3 but less than D2. The first ion species 250 may also be diffused further into the target layer 208 during the annealing process 262. In some embodiments, this further diffusion is taken into account when designing the depths of D1 and D2 (see the discussion of the operations 106 and 108 above). For example, during the operations 106 and 108, a depth budget may be allocated to accommodate this further diffusion (as well as any further diffusion in subsequent thermal processes). In an embodiment, the second ion species 260 is phosphorous (P). To further this embodiment, the operation 112 performs the annealing process 262 at a temperature in a range from about 950° C. to about 1025° C. and for duration in a range from about 10 seconds to about 30 seconds. As a result, the depth D4 is in a range from about 1342 Å to about 3000 Å. After the annealing process 262, the thickness of the top portion 208C that includes the ion species 260 grows from D3 to D4. The above annealing temperature and annealing time affect the ions' diffusion length. The disclosed annealing temperature and annealing time are selected to achieve the desired depth D4 (after annealing) from the initial implanted depth D3 (before annealing). Also, the annealing temperature is selected so that the device 200 can withstand the annealing process without being damaged.

Figure 2G:
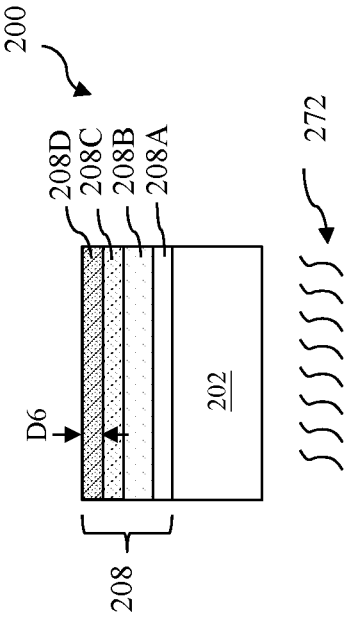
Figure 2H:
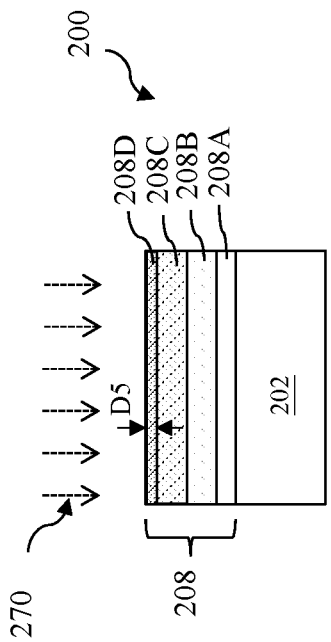

At operation 114, the method 100 (FIG. 1A) implants ions of a third species 270 (also referred to as ions 270) into the target layer 208 (FIG. 2G). Referring to FIG. 2G, a top portion 208D of the target layer 208 is implanted with ions of the third species 270. The top portion 208D has a thickness of D5, which is smaller than D3 or D4. For example, the thickness D5 may be in a range from about 600 Å to about 750 Å in some embodiments, such as about 692 Å. The upper limit of the thickness D5 should be designed to be smaller than the thickness D4. Even further, after the ions 270 are diffused in the target layer 208, the depth D6 (as shown in FIG. 2H) should be less than the thickness D4 in order to create a stack of ion-implanted layers. The lower limit of the thickness D5 should be designed according to how many ion-implanted layers will be included in the top portion 208D and the thickness of each such layer. If D5 is too small, it may not be feasible to add these layers into the layer 208D. If the layer 208D is the top-most of the stacked ion-implanted layers, then its thickness may be designed according to the desired optical property (anti-reflectivity) of the layer 208. For example, the stacked layers 208D/208C/208B/208A should provide a gradient reflective and refractive indexes in various embodiments. The third species 270 may be selected from, but not restricted to, the group consisting of boron, phosphorus, arsenic, germanium, fluorine, silicon, aluminum, nitrogen, carbon, argon, oxygen, and hydrogen. In the present embodiment, the third ion species 270 is selected to be larger (i.e., having a greater atomic mass) than the second ion species 260 in order to create the desired anti-reflectivity in the stacked ion-implanted layers. Also, using a larger ion species in the operation 114 than in the operation 110 allows the two operations to use the same or similar implantation energy to create a stack of ion-implanted layers 208D and 208C where the layer 208D is shallower than the layer 208C. This simplifies the manufacturing process, for example, the same ion implantation energy may be maintained in the various operations in the method 100. In an embodiment, the third ion species 270 is arsenic (As). To further this embodiment, the operation 114 performs the As ion implantation with an energy dose in a range from about 30 KeV to about 100 KeV and an ion dose in a range from about 1E13 ions/cm$^2$ to about 1E14 ions/cm$^2$. The ranges of energy dose and ion dose may be selected based on the materials of the target layer 208, the ion species 270, the desired depth D5, and the desired reflective and refractive index of the ion-implanted layer 208D. The range of energy dose affects how deep the ions are implanted, hence affecting the depth D5. If the energy dose is too high or too low, it will not achieve the desired depth D5. The range of ion dose affects the amount of impurity doping, which in turn affects the reflective and refractive index of the ion-implanted layer 208D. If the ion dose is too high or too low, it will not achieve the desired optical property of the ion-implanted layer 208D. In an embodiment, the energy dose in the operation 114 varies (e.g., with a uniform distribution) in the range from about 30 KeV to about 100 KeV so that the ions 270 are near uniformly distributed in the layer 208D. For example, with a higher energy dose, the ions tend to travel deeper into the target layer 208, and with a lower energy dose, the ions tend to travel shallower into the target layer 208. Further, the ion distribution is typically Gaussian. Therefore, by varying the energy dose, the layer 208D can be implanted with near uniform impurity concentration throughout its thickness D5. Further, the energy dose can be gradually increasing, gradually decreasing, oscillating between a minimum and a maximum, or by other means in various embodiments.

At operation 116, the method 100 (FIG. 1A) performs an annealing process 272 to the structure 200 including the target layer 208 implanted with the first, second, and third ion species 250, 260, and 270 (FIG. 2H). The annealing process 272 causes the ions 270 to diffuse deeper into the target layer 208 to depth D6 that is greater than D5 but less than D4. The first ion species 250 and the second ion species 260 may also be diffused further into the target layer 208 during the annealing process 272. In an embodiment, the third ion species 270 is arsenic (As). To further this embodiment, the operation 116 performs the annealing process 272 at a temperature in a range from about 950° C. to about 1025° C. and for duration in a range from about 10 seconds to about 30 seconds. As a result, the depth D6 is in a range from about 692 Å to about 2000 Å. After the annealing process 272, the thickness of the top portion 208D that includes the ion species 270 grows from D5 to D6. The above annealing temperature and annealing time affect the ions' diffusion length. The disclosed annealing temperature and annealing time are selected to achieve the desired depth D6 (after annealing) from the initial implanted depth D5 (before annealing). Also, the annealing temperature is selected so that the device 200 can withstand the annealing process without being damaged.

In another embodiment, the method 100 may implant additional ion species (e.g., the fourth ion species, the fifth ion species, the sixth ion species, and so on) into the target layer 208. In a further embodiment, each of the additional ion species is heavier (or having a greater atomic mass) than any previously implanted ion species and is implanted to a smaller depth than any previously ion species. Using a heavier ion species in an operation than in the previous operation allows the two operations to use the same or similar implantation energy to create a stack of ion-implanted layers where the later-implanted layer is shallower than the previously-implanted layer. This simplifies the manufacturing process, for example, the same ion implantation energy may be maintained in the various operations in the method 100.

In an embodiment, the method 100 may perform one annealing process (instead of separate annealing processes 252, 262, and 272) after all three (or more) ion species 250, 260, and 270 have been implanted into the target layer 208, such as shown in FIG. 1B. This saves production time. However, performing separate annealing processes after each ion implantation may provide good tunability of the refractive indexes of the ion-implanted layers.

By doing the ion implantation as discussed above (e.g., the operations 106, 110, and 114), the method 100 forms multiple ion-implanted layers (or sub-layers) in the target layer 208. As shown in FIG. 2H, the target layer 208 now includes sub-layers 208A, 208B, 208C, and 208D. The sub-layer 208A includes the original material of the target layer 208 and has negligible implanted ions 250, 260, and 270. The sub-layer 208B includes the original material of the target layer 208 implanted with the ion species 250, and has negligible implanted ions 260 and 270. The sub-layer 208C includes the original material of the target layer 208 implanted with the ion species 250 and 260, and has negligible implanted ions 270. The sub-layer 208D includes the original material of the target layer 208 implanted with the ion species 250, 260 and 270.

By doing the annealing process(es) as discussed above (e.g., the separate operations 108, 112, and 116 or a single collective annealing process), each of the sub-layers 208B, 208C, and 208D include ions that are distributed in a gradient mode along the Z direction. For example, each of the sub-layers may have more ions (or a higher ion density) at the top portion than at the bottom portion thereof. Effectively, the annealing process(es) results in inhomogeneous ion-implanted sub-layers 208B, 208C, and 208D. Within each sub-layer, the refractive index gradually changes along the depth direction Z.

The sub-layers 208A, 208B, 208C, and 208D can be tuned to provide appropriate refractive indexes and thicknesses for reducing reflectivity at the top surface of the target layer 208 (where a photoresist is to be coated) for a given radiation wavelength such as 365 nm (I-line), 248 nm (KrF excimer laser), 193 nm (ArF excimer laser), or 13.8 nm (EUV). Factors that affect the refractive indexes and thicknesses for each of the sub-layers include the ion species, ion implantation energy dose, ion dose, annealing temperature, and annealing duration. Furthermore, the material of the target layer 208, the material of a resist (e.g., the resist 214 to be discussed with reference to FIG. 2I), and the radiation wavelength (e.g., the radiation 216 to be discussed with reference to FIG. 2K) are other factors to be considered. The various factors may be modeled in a computer program, and the method 100 is simulated to determine working ranges for the ion species, ion implantation energy dose, ion dose, annealing temperature, and annealing duration. To that extent, the specific ion species, the energy dose range, the ion dose range, the annealing temperature range, and the annealing duration range disclosed above (e.g., in the operations 106-116) are examples and are not intended to limit the present disclosure beyond what is explicitly recited in the claims. In a further embodiment, the sub-layers 208A, 208B, 208C, and 208D may each be light absorbing.

Effectively, by doing both the ion implantation and the annealing processes as discussed above, the method 100 turns the target layer 208 into an anti-reflective coating (ARC) that has the properties of both multi-layer ARC and inhomogeneous ARC. Compared with methods that form a multi-layer ARC by multiple depositions, the disclosed method 100 performs one deposition process (e.g., the operation 104), saving production time. Compared with some organic inhomogeneous ARC, the disclosed ARC layer (the ion-implanted target layer 208) provides better etching resistance in subsequent lithography processes. The ion-implanted target layer 208 is also referred to as the ARC layer 208 in the present disclosure.

At operation 118, the method 100 (FIG. 1C) forms a resist layer 214 over the ARC layer 208. Referring to FIG. 2I, in an embodiment, the resist layer 214 is formed by spin coating a resist material over the ARC layer 208, followed by a soft baking process and/or a hard baking process. In an embodiment, the resist layer 214 is a DUV resist such as a krypton fluoride (KrF) resist or an argon fluoride (ArF) resist. In another embodiment, the resist layer 214 is an I-line resist, a EUV resist, an electron beam (e-beam) resist, or an ion beam resist. The type of the resist layer 214 is chosen according to the radiation wavelength to be applied thereon. In the present embodiment, the resist layer 214 is a positive resist. A positive resist is typically insoluble in a developer but becomes soluble upon radiation. One exemplary positive resist is a chemically amplified resist (CAR) that contains backbone polymer protected by ALGs and further contains photo-acid generators (PAGs). The PAGs can produce an acid upon radiation and the acid can catalyze the cleaving of the ALGs from the backbone polymer, increasing the polymer's solubility to a positive tone developer. In an alternative embodiment, the resist layer 214 is a negative resist. A negative resist is typically soluble in a developer but becomes insoluble upon radiation, for example, by cross-linking smaller polymer segments to form a larger polymer upon radiation.

At operation 120, the method 100 (FIG. 1C) implant ions of another species 280 (also referred to as ions 280) to the resist layer 214 (FIG. 2J) in order to reduce the reflectivity at the top surface of the resist layer 214. Referring to FIG. 2J, a top portion 214B of the resist layer 214 is implanted with ions 280. The ion-implanted resist layer 214B may be referred to as Top Anti-Reflective Coating (TARC), while the ARC layer 208 is referred to as Bottom Anti-Reflective Coating (BARC). In an embodiment, the ion species 280 may be selected from, but not restricted to, the group consisting of boron, phosphorus, arsenic, germanium, fluorine, silicon, aluminum, nitrogen, carbon, argon, oxygen, and hydrogen. In an embodiment, the ion species 280 is aluminum. To further this embodiment, the operation 120 performs the ion implantation with an energy dose in a range from about 30 KeV to about 100 KeV and an ion dose in a range from about 1E13 ions/cm$^2$ to about 1E14 ions/cm$^2$. The ranges of energy dose and ion dose may be selected based on the materials of the resist layer 214, the ion species 270, the desired thickness D7 of the ion-implanted layer 214B, and the desired reflective and refractive index of the ion-implanted layer 214B. The range of energy dose affects how deep the ions are implanted, hence affecting the depth D7. If the energy dose is too high or too low, it will not achieve the desired depth D7. The range of ion dose affects the amount of impurity doping, which in turn affects the reflective and refractive index of the ion-implanted layer 214B. If the ion dose is too high or too low, it will not achieve the desired optical property of the ion-implanted layer 214B. In an embodiment, the energy dose in the operation 120 varies (e.g., with a uniform distribution) in the range from about 30 KeV to about 100 KeV so that the ions 280 are near uniformly distributed in the resist portion 214B. In an embodiment, the TARC layer 214B has a thickness D7 in a range from about 1 Å to about 1,000 Å. The selected thickness is one of the factors that affect how the layer 214B reduces reflection. The ion species, ion implantation energy dose, and ion dose are designed such that the refractive index and the thickness of this TARC layer 214B cause destructive interference between lights reflected at the 214/214B interface and at the 214B/ambient interface. In an embodiment, the method 100 does not perform the operation 120 (i.e., the operation 120 is optional for the method 100).

At operation 122, the method 100 (FIG. 1C) patterns the resist layer 214 (which may or may not include the TARC layer 214B). This includes multiple steps, such as exposing, post-exposure baking, and developing. Referring to FIG. 2K, shown therein is the resist layer 214 being exposed to a radiation 216 through a mask 218. In an embodiment, the radiation 216 is a DUV radiation such as KrF excimer laser (248 nm) or ArF excimer laser (193 nm). Alternatively, the radiation 216 may be an I-line (365 nm), a EUV radiation (e.g., 13.8 nm), an e-beam, an x-ray, an ion beam, or other suitable radiations. The radiation 216 causes the PAGs in the resist layer 214 to produce an acid. The exposure may be performed in air, in a liquid (immersion lithography), or in a vacuum (e.g., for EUV lithography and e-beam lithography). In the embodiment as shown, the radiation 216 is patterned with the mask 218, such as a transmissive mask or a reflective mask, which may include resolution enhancement techniques such as phase-shifting and/or optical proximity correction (OPC). In another embodiment, the radiation 216 is directly modulated with a predefined pattern, such as an IC layout, without using a mask (i.e., it is maskless lithography). The wavelength(s) of the radiation 216 is a factor to be considered when designing the operations 104-116 as discussed above. The ARC layer 208 is tuned to absorb the radiation 216 that passes through the resist layer 214 (e.g., by destructive interference at interfaces between the various sub-layers of the ARC layer 208), thereby reducing reflections of the radiation 216 off of any complicated topography on the substrate 202. This improves the CD uniformity of the resist pattern 214 (see FIG. 2L).

Referring to FIG. 2L, after undergoing one or more post-exposure baking (PEB) processes and a developing process in a developer, portions of the exposed resist layer 214 are removed, resulting in a patterned resist layer 214 (or resist pattern 214). The resist pattern 214 has various openings 220. In some embodiments, a developer includes a water based developer, such as tetramethylammonium hydroxide (TMAH) for a positive tone development (PTD). In other embodiments, a developer may include an organic solvent or a mixture of organic solvents, such as methyl a-amyl ketone (MAK) or a mixture involving the MAK, for a negative tone development (NTD). Applying a developer includes spraying the developer on the exposed resist layer 214, for example, by a spin-on process. The developing process may further include a post development baking (PDB) process.

At operation 124, the method 100 (FIG. 1C) etches the ARC layer 208 through the openings 220. Referring to FIG. 2M, the resist pattern 214 acts as an etch mask to protect the rest of the ARC layer 208 from the etching process. In an embodiment, the etching process is a dry etching process. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

At operation 126, the method 100 (FIG. 1C) processes the substrate 202 with the patterned ARC layer 208, or both the resist pattern 214 and the patterned ARC layer 208, as a process mask, such as shown in FIGS. 2N-1 and 2N-2. Many processes may be performed by the operation 126. In an embodiment, the operation 126 includes an ion implantation to the substrate 202. For example, an ion implantation may be used for forming lightly doped source/drain (LDD) or heavily doped source/drain (HDD) in the substrate 202, such as shown in FIG. 2N-1. In this embodiment, the patterned ARC layer 208 masks the areas of the substrate 202 that do not receive the ion implantation. In another embodiment, the operation 126 includes an etching process. For example, the operation 126 may etch the substrate 202 through the openings 220, such as shown in FIG. 2N-2. In this embodiment, the patterned ARC layer 208 masks the areas of the substrate 202 that are not to be etched.

At operation 128, the method 100 (FIG. 1C) removes the resist pattern 214 and the patterned ARC layer 208 from the structure 200 such as shown in FIGS. 2O-1 and 2O-2, which are successors of FIGS. 2N-1 and 2N-2 respectively. The resist pattern 214 may be removed by resist stripping or ashing. The patterned ARC layer 208 may be removed by dry etching, wet etching, or other suitable methods. Further steps may be performed to the structure 200. For example, the method 100 may form ICs on the structure 200 or may form a mask or a reticle on the structure 200.

Although not intended to be limiting, one or more embodiments of the present disclosure provide many benefits to a semiconductor device or structure, and the formation thereof. The disclosed method of forming an ARC layer by ion implantation is more efficient that those multi-deposition methods because ion implantation processes are typically faster than CVD or PVD deposition techniques. Also, the disclosed method can create more layers with different and fine-tuned refractive indexes than those multi-deposition methods. Further, the disclosed method can create an ARC layer with gradient refractive indexes to achieve a lower reflectivity than some ARC layers formed by multi-deposition methods. Still further, the ion-implanted ARC layer according to the present disclosure typically provides better etching resistance than some inhomogeneous organic films such as nano-porous films.

In one exemplary aspect, the present disclosure is directed to a method for lithography patterning. The method includes depositing a target layer over a substrate; reducing a reflection of a light incident upon the target layer by implanting ions into the target layer, resulting in an ion-implanted target layer; coating a photoresist layer over the ion-implanted target layer; exposing the photoresist layer to the light using a photolithography process, wherein the target layer reduces reflection of the light at an interface between the ion-implanted target layer and the photoresist layer during the photolithography process; developing the photoresist layer to form a resist pattern; etching the ion-implanted target layer with the resist pattern as an etch mask; processing the substrate using at least the etched ion-implanted target layer as a process mask; and removing the etched ion-implanted target layer.

In an embodiment of the method, the processing of the substrate includes etching the substrate. In another embodiment, before the exposing of the photoresist layer, the method further includes implanting ions into the photoresist layer to form an anti-reflective layer at a top portion of the photoresist layer. In an embodiment, the ions are selected from the group consisting of: boron, phosphorus, arsenic, germanium, fluorine, silicon, aluminum, nitrogen, carbon, argon, oxygen, and hydrogen.

In an embodiment, the implanting of ions into the target layer includes implanting ions of a first species into the target layer and implanting ions of a second species into the target layer after the implanting of ions of the first species, wherein the first species has a smaller atomic mass than the second species. In a further embodiment, the implanting of ions of the first species and the implanting of ions of the second species are performed with about same implantation energy dose and ion dose.

In an embodiment, before the coating of the photoresist layer, the method further includes annealing the ion-implanted target layer. In embodiments, the substrate includes a silicon wafer or a mask substrate. In embodiments, the target layer includes one of: silicon, silicon oxide, silicon nitride, and a film including a metal.

In another exemplary aspect, the present disclosure is directed to a method for lithography patterning. The method includes depositing a target layer over a substrate, the target layer including an inorganic material; changing reflectivity of the target layer by implanting ions of a first species into the target layer and implanting ions of a second species into the target layer having the first species, wherein the first species has a smaller atomic mass than the second species, resulting in an ion-implanted target layer; coating a photoresist layer over the ion-implanted target layer; exposing the photoresist layer using a photolithography process; developing the photoresist layer to form a resist pattern; etching the ion-implanted target layer with the resist pattern as an etch mask, resulting in a patterned ion-implanted target layer; and processing the substrate with at least the patterned ion-implanted target layer as a process mask.

In an embodiment, the method further includes implanting ions of a third species into the target layer having the first and second species before the exposing of the photoresist layer, wherein the second species has a smaller atomic mass than the third species. In a further embodiment, the first species is boron, the second species is phosphorus, and the third species is arsenic.

In another embodiment, the method further includes annealing the target layer after the implanting of ions of the first species and before the exposing of the photoresist layer and annealing the target layer after the implanting of ions of the second species and before the exposing of the photoresist layer.

In embodiments, the target layer includes one of: silicon, silicon oxide, silicon nitride, and a film having a metal, and the first species and the second species are selected from the group consisting of: boron, phosphorus, arsenic, germanium, fluorine, silicon, aluminum, nitrogen, carbon, argon, oxygen, and hydrogen. In an embodiment, the method further includes removing the patterned ion-implanted target layer after the processing of the substrate.

In yet another exemplary aspect, the present disclosure is directed to a method for lithography patterning. The method includes depositing a target layer over a substrate, the target layer including an inorganic material; implanting boron ions into the target layer with a first energy dose in a range from about 30 KeV to about 100 KeV and a first ion dose in a range from about 1E13 ions/cm$^2$ to about 1E14 ions/cm$^2$; implanting phosphorus ions into the target layer after the implanting of boron ions with a second energy dose from about 30 KeV to about 100 KeV and a second ion dose from about 1E13 ions/cm$^2$ to about 1E14 ions/cm$^2$; implanting arsenic ions into the target layer after the implanting of phosphorus ions with a third energy dose from about 30 KeV to about 100 KeV and a third ion dose from about 1E13 ions/cm$^2$ to about 1E14 ions/cm$^2$; coating a photoresist layer over the target layer after the implanting of arsenic ions; and exposing the photoresist layer using a photolithography process.

In an embodiment, the method further includes annealing the target layer at a temperature in a range from about 950° C. to about 1025° C. for duration in a range from about 10 seconds to about 30 seconds after the implanting of boron ions and before the implanting of phosphorus ions. In a further embodiment, the method includes annealing the target layer at a temperature in a range from about 950° C. to about 1025° C. for duration in a range from about 10 seconds to about 30 seconds after the implanting of phosphorus ions and before the implanting of arsenic ions. In a further embodiment, the method includes annealing the target layer at a temperature in a range from about 950° C. to about 1025° C. for duration in a range from about 10 seconds to about 30 seconds after the implanting of arsenic ions and before the coating of the photoresist layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for lithography patterning, comprising:
   depositing a target layer over a substrate;
   reducing a reflection of a light incident upon the target layer by implanting ions into the target layer, resulting in an ion-implanted target layer;
   coating a photoresist layer over the ion-implanted target layer;
   exposing the photoresist layer to the light using a photolithography process, wherein the target layer reduces reflection of the light at an interface between the ion-implanted target layer and the photoresist layer during the photolithography process;
   developing the photoresist layer to form a resist pattern;
   etching the ion-implanted target layer with the resist pattern as an etch mask;
   processing the substrate using at least the etched ion-implanted target layer as a process mask; and
   removing the etched ion-implanted target layer.

2. The method of claim 1, wherein the processing of the substrate includes etching the substrate.

3. The method of claim 1, before the exposing of the photoresist layer, further comprising:
   implanting ions into the photoresist layer to form an anti-reflective layer at a top portion of the photoresist layer.

4. The method of claim 1, wherein the ions are selected from the group consisting of: boron, phosphorus, arsenic, germanium, fluorine, silicon, aluminum, nitrogen, carbon, argon, oxygen, and hydrogen.

5. The method of claim 1, wherein the implanting of ions into the target layer includes:
   implanting ions of a first species into the target layer; and
   implanting ions of a second species into the target layer after the implanting of ions of the first species, wherein the first species has a smaller atomic mass than the second species.

6. The method of claim 5, wherein the implanting of ions of the first species and the implanting of ions of the second species are performed with about same implantation energy dose and ion dose.

7. The method of claim 1, before the coating of the photoresist layer, further comprising:
   annealing the ion-implanted target layer.

8. The method of claim 1, wherein the substrate includes a silicon wafer or a mask substrate.

9. The method of claim 1, wherein the target layer includes one of: silicon, silicon oxide, silicon nitride, and a film including a metal.

10. A method for lithography patterning, comprising:
    depositing a target layer over a substrate, the target layer including an inorganic material;
    changing reflectivity of the target layer by implanting ions of a first species into the target layer and implanting ions of a second species into the target layer having the first species, wherein the first species has a smaller atomic mass than the second species, resulting in an ion-implanted target layer;
    coating a photoresist layer over the ion-implanted target layer;
    exposing the photoresist layer using a photolithography process;
    developing the photoresist layer to form a resist pattern;
    etching the ion-implanted target layer with the resist pattern as an etch mask, resulting in a patterned ion-implanted target layer; and
    processing the substrate with at least the patterned ion-implanted target layer as a process mask.

11. The method of claim 10, further comprising:
    implanting ions of a third species into the target layer having the first and second species before the exposing of the photoresist layer, wherein the second species has a smaller atomic mass than the third species.

12. The method of claim 11, wherein the first species is boron, the second species is phosphorus, and the third species is arsenic.

13. The method of claim 10, further comprising:
annealing the target layer after the implanting of ions of the first species and before the exposing of the photoresist layer; and
annealing the target layer after the implanting of ions of the second species and before the exposing of the photoresist layer.

14. The method of claim 10, wherein the target layer includes one of: silicon, silicon oxide, silicon nitride, and a film having a metal.

15. The method of claim 10, wherein the first species and the second species are selected from the group consisting of: boron, phosphorus, arsenic, germanium, fluorine, silicon, aluminum, nitrogen, carbon, argon, oxygen, and hydrogen.

16. The method of claim 10, further comprising:
removing the patterned ion-implanted target layer after the processing of the substrate.

17. A method for lithography patterning, comprising:
depositing a target layer over a substrate, the target layer including an inorganic material;
implanting boron ions into the target layer with a first energy dose in a range from about 30 KeV to about 100 KeV and a first ion dose in a range from about 1E13 ions/cm$^2$ to about 1E14 ions/cm$^2$;
implanting phosphorus ions into the target layer after the implanting of boron ions with a second energy dose from about 30 KeV to about 100 KeV and a second ion dose from about 1E13 ions/cm$^2$ to about 1E14 ions/cm$^2$;
implanting arsenic ions into the target layer after the implanting of phosphorus ions with a third energy dose from about 30 KeV to about 100 KeV and a third ion dose from about 1E13 ions/cm$^2$ to about 1E14 ions/cm$^2$;
coating a photoresist layer over the target layer after the implanting of arsenic ions; and
exposing the photoresist layer using a photolithography process.

18. The method of claim 17, further comprising:
annealing the target layer at a temperature in a range from about 950° C. to about 1025° C. for duration in a range from about 10 seconds to about 30 seconds after the implanting of boron ions and before the implanting of phosphorus ions.

19. The method of claim 18, further comprising:
annealing the target layer at a temperature in a range from about 950° C. to about 1025° C. for duration in a range from about 10 seconds to about 30 seconds after the implanting of phosphorus ions and before the implanting of arsenic ions.

20. The method of claim 19, further comprising:
annealing the target layer at a temperature in a range from about 950° C. to about 1025° C. for duration in a range from about 10 seconds to about 30 seconds after the implanting of arsenic ions and before the coating of the photoresist layer.

* * * * *